(12) United States Patent
Jain et al.

(10) Patent No.: US 11,397,457 B2
(45) Date of Patent: Jul. 26, 2022

(54) DYNAMIC POWER CAPPING OF COMPUTING SYSTEMS AND SUBSYSTEMS CONTAINED THEREIN

(71) Applicant: Microsoft Technology Licensing, LLC, Redmond, WA (US)

(72) Inventors: Vishal Jain, Bellevue, WA (US); Teague Curtiss Mapes, Woodinville, WA (US); Neeraj Ladkani, Bothell, WA (US); Sunny Gautam, Seattle, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/914,080

(22) Filed: Jun. 26, 2020

(65) Prior Publication Data
US 2021/0405728 A1 Dec. 30, 2021

(51) Int. Cl.
*G06F 1/3228* (2019.01)
*G06F 1/329* (2019.01)
(Continued)

(52) U.S. Cl.
CPC ............ *G06F 1/3228* (2013.01); *G06F 1/329* (2013.01); *G06F 1/3296* (2013.01); *H05K 7/1487* (2013.01); *H05K 7/1492* (2013.01)

(58) Field of Classification Search
CPC . G06F 1/329; G06F 1/206; G06F 1/26; G06F 1/263; G06F 1/30; G06F 1/32;
(Continued)

(56) References Cited

U.S. PATENT DOCUMENTS 9,880,599 B1    1/2018  Allen-Ware et al.
2011/0144818 A1* 6/2011  Li ........................ G06F 1/3203
                                                    700/291
(Continued)

OTHER PUBLICATIONS

"International Search Report and Written Opinion Issued in PCT Application No. PCT/US2021/027874", dated Jul. 30, 2021, 11 Pages.

*Primary Examiner* — Terrell S Johnson
(74) *Attorney, Agent, or Firm* — Ray Quinney & Nebeker P.C; James Bullough

(57) ABSTRACT

One aspect of the present disclosure involves dynamically performing power capping with respect to a group of computing systems. Different priority levels can be assigned to at least some of the individual computing systems within the group of computing systems. Individual power limits can be set for the plurality of individual computing systems based at least in part on the different priority levels and utilization levels of the plurality of individual computing systems. Another aspect of the present disclosure involves dynamically performing power capping with respect to various subsystems of a computing system. Different priority levels can be assigned to at least some of the plurality of individual subsystems within the computing system. Individual power limits can be set for the plurality of individual subsystems based at least in part on the different priority levels and current power consumption of the plurality of individual subsystems.

18 Claims, 8 Drawing Sheets

(51) Int. Cl.
*G06F 1/3296* (2019.01)
*H05K 7/14* (2006.01)

(58) Field of Classification Search
CPC .... G06F 1/3206; G06F 1/3268; G06F 1/3275; G06F 3/0688; G06F 9/546
See application file for complete search history.

(56) References Cited

U.S. PATENT DOCUMENTS

| | | | |
|---|---|---|---|
| 2012/0078430 A1* | 3/2012 | Fan | G06F 1/329 |
| | | | 700/295 |
| 2014/0359310 A1 | 12/2014 | Haridass et al. | |
| 2015/0121113 A1* | 4/2015 | Ramamurthy | H02J 7/00712 |
| | | | 713/340 |
| 2015/0153810 A1* | 6/2015 | Sasidharan | G06F 1/329 |
| | | | 713/320 |
| 2016/0077570 A1* | 3/2016 | Varadarajan | H04L 12/10 |
| | | | 713/322 |
| 2017/0269669 A1* | 9/2017 | Choi | G11C 16/30 |
| 2020/0012334 A1* | 1/2020 | Bodireddy | G06F 1/3234 |

\* cited by examiner

DYNAMIC POWER CAPPING OF COMPUTING SYSTEMS AND SUBSYSTEMS CONTAINED THEREIN

CROSS-REFERENCE TO RELATED APPLICATIONS

N/A

BACKGROUND

Power capping is a technique for controlling the total amount of power that is consumed by one or more computing systems. Power capping can be performed in a variety of different situations.

As one example, power capping can be performed with respect to servers within a datacenter. A datacenter typically includes a large number of servers, which may be stacked in racks that are placed in rows. A power management entity for the datacenter can define a power limit for each rack of servers. The power limit for a rack of servers can represent the total amount of power that all of the servers within the rack are collectively permitted to use. Each rack of servers can include a rack manager that performs management operations for the servers within the rack. The rack manager for a rack of servers can ensure that the total power consumption of the rack of servers does not exceed the defined power limit. This can include setting power limits for the individual servers within the rack. The individual power limits can be set so that the sum of the individual power limits for all of the servers in the rack does not exceed the total power limit for the rack as a whole.

With current approaches, the total power limit for a rack of servers is uniformly divided among the servers in the rack. For example, if there are N servers within a rack and $P_{total}$ represents the total power limit for the rack, then each of the servers is assigned a power limit of $P^{total}/N$. However, this uniform distribution of the total power limit can be inefficient, because the workloads of the various servers within the rack may not be equal. For example, if one of the servers in the rack is actively running multiple workloads while another server in the rack is idle, setting equal power limits for these servers can result in less than optimal performance. The power limit assigned to the active server might be lower than what the active server needs for best performance, while the power limit assigned to the idle server is probably considerably higher than what the idle server is actually using.

Power capping can also be performed with respect to each individual server within a rack of servers. Each server can include a power management controller that enforces the power limit for that server. The power management controller for a particular server can ensure that the power consumption of the server does not exceed the power limit that has been defined for that server. This can include setting power limits for the various subsystems within a particular server (e.g., central processing unit (CPU), graphics processing unit (GPU), memory, storage, input/output (I/O) subsystem, network interface controller).

One way to set power limits for individual subsystems is to uniformly allocate the total power limit for a particular server among the subsystems within the server. However, this uniform allocation of power limits can be inefficient. For example, suppose that a server is running a workload that requires a significant amount of processing but does not require significant use of the other subsystems. In this case, because the processor is being used more heavily than the other subsystems, it would ideally be desirable to allocate a majority of the available power to the processor. Therefore, uniformly allocating power to all of the subsystems can result in less than optimal performance.

SUMMARY

In accordance with one aspect of the present disclosure, a method is disclosed for dynamically performing power capping with respect to a group of computing systems. The group of computing systems includes a plurality of individual computing systems. The method includes assigning different priority levels to at least some of the plurality of individual computing systems within the group of computing systems, determining a total power limit for the group of computing systems, determining utilization levels of the plurality of individual computing systems within the group of computing systems, and setting individual power limits for the plurality of individual computing systems within the group of computing systems based at least in part on the total power limit, the different priority levels, and the utilization levels.

Assigning the different priority levels may include assigning a first priority level to a first computing system and assigning a second priority level to a second computing system. Setting the individual power limits may include setting a first power limit for the first computing system and setting a second power limit for the second computing system. The first priority level may be higher than the second priority level. The first power limit may be higher than the second power limit.

Assigning the different priority levels may include assigning a first priority level to a first computing system and assigning a second priority level to a second computing system. Determining the utilization levels may include determining a first utilization level of the first computing system and determining a second utilization level of the second computing system. Setting the individual power limits may include setting a first power limit for the first computing system and setting a second power limit for the second computing system. The first priority level may be equal to the second priority level. The first utilization level may be higher than the second utilization level. The first power limit may be higher than the second power limit.

Assigning the different priority levels may include receiving user input specifying at least some of the different priority levels for the plurality of individual computing systems.

Assigning the different priority levels may include automatically determining at least some of the different priority levels based at least in part on historical information about the plurality of individual computing systems within the group of computing systems.

The group of computing systems may include a plurality of servers in a datacenter. The plurality of servers may be located within a rack. The method may be implemented by a rack manager corresponding to the rack.

A sum of the individual power limits for the plurality of individual computing systems within the group of computing systems may not exceed the total power limit for the group of computing systems.

The method may further include causing power consumption of the plurality of individual computing systems within the group of computing systems to be adjusted to satisfy the individual power limits.

In accordance with another aspect of the present disclosure, a method is disclosed for dynamically performing power capping with respect to a plurality of individual subsystems within a computing system. The method includes assigning different priority levels to at least some of the plurality of individual subsystems within the computing system, determining a total power limit for the computing system, determining current power consumption of the plurality of individual subsystems within the computing system, and setting individual power limits for the plurality of individual subsystems within the computing system based at least in part on the different priority levels, the total power limit, and the current power consumption.

Assigning the different priority levels may include assigning a first priority level to a first subsystem and assigning a second priority level to a second subsystem. Setting the individual power limits may include setting a first power limit for the first subsystem and setting a second power limit for the second subsystem. The first priority level may be higher than the second priority level. The first power limit may be higher than the second power limit.

Assigning the different priority levels may include assigning a first priority level to a first subsystem and assigning a second priority level to a second subsystem. Determining the current power consumption may include determining a first power consumption of the first subsystem and determining a second power consumption of the second subsystem. Setting the individual power limits may include setting a first power limit for the first subsystem and setting a second power limit for the second subsystem. The first priority level may be equal to the second priority level. The first power consumption may be higher than the second power consumption. The first power limit may be higher than the second power limit.

Assigning the different priority levels may include receiving user input specifying at least some of the different priority levels for the plurality of individual subsystems.

Assigning the different priority levels may include automatically determining at least some of the different priority levels based at least in part on historical information about the plurality of individual subsystems.

The method may be implemented by an auxiliary service processor within the computing system.

A sum of the individual power limits for the plurality of individual subsystems may not exceed the total power limit for the computing system.

The method may further include causing power consumption of the plurality of individual subsystems to be adjusted to satisfy the individual power limits.

The method may further include determining a plurality of weights corresponding to the plurality of individual subsystems within the computing system. The plurality of weights may depend at least in part on the different priority levels that have been assigned to the plurality of individual subsystems. The method may further include applying the plurality of weights to a proportional difference between the total power limit for the computing system and a total current power consumption of the computing system.

In accordance with another aspect of the present disclosure, a system is disclosed for dynamically performing power capping with respect to a plurality of individual subsystems within a computing system. The system includes one or more processors, memory in electronic communication with the one or more processors, and priority information stored in the memory. The priority information may include different priority levels for at least some of the plurality of individual subsystems within the computing system. The system also includes instructions stored in the memory. The instructions may be executable by the one or more processors to determine a total power limit for the computing system, determine current power consumption of the plurality of individual subsystems within the computing system, and set individual power limits for the plurality of individual subsystems within the computing system based at least in part on the different priority levels, the total power limit, and the current power consumption.

The different priority levels may include a first priority level assigned to a first subsystem and a second priority level assigned to a second subsystem. Setting the individual power limits may include setting a first power limit for the first subsystem and setting a second power limit for the second subsystem. The first priority level may be higher than the second priority level. The first power limit may be higher than the second power limit.

The different priority levels may include a first priority level assigned to a first subsystem and a second priority level assigned to a second subsystem. Determining the current power consumption may include determining a first power consumption of the first subsystem and determining a second power consumption of the second subsystem. Setting the individual power limits may include setting a first power limit for the first subsystem and setting a second power limit for the second subsystem. The first priority level may be equal to the second priority level. The first power consumption may be higher than the second power consumption. The first power limit may be higher than the second power limit.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

Figure 1:
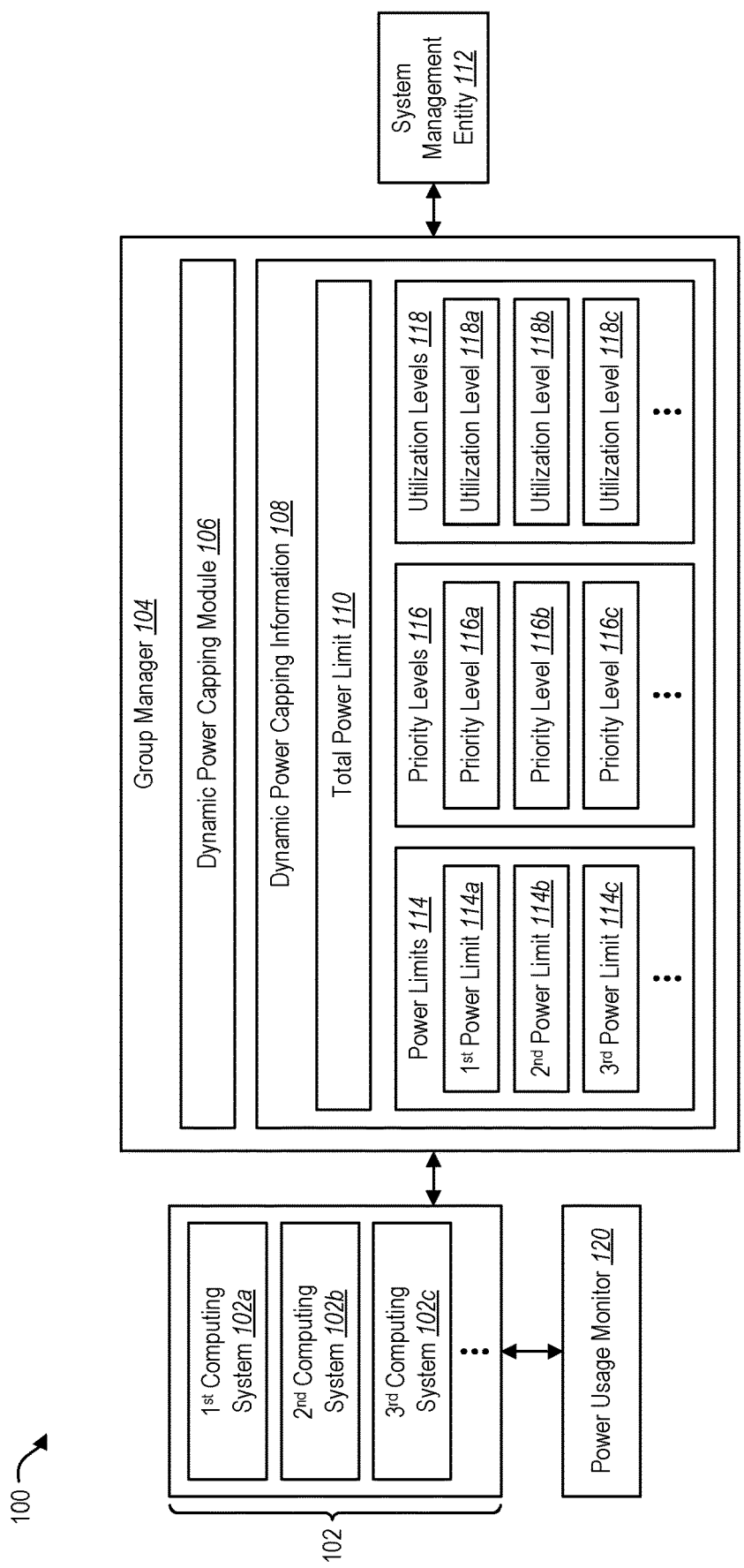
FIG. 1 illustrates an example of an operating environment in which dynamic power capping can be performed with respect to a group of computing systems.

One aspect of the present disclosure is related to techniques for dynamically performing power capping with respect to a group of computing systems. For example, dynamic power capping can be performed with respect to a group of servers in a datacenter, such as the servers within a particular rack.

A total power limit can be set for a group of computing systems (e.g., the servers within a rack). The total power limit can represent the total amount of power that the group of computing systems is collectively permitted to use. In addition, individual power limits can be set for the individual computing systems within the group. The individual power limit for a particular computing system can represent the total amount of power that the computing system is permitted to use. The individual power limits can be set so that the sum of the individual power limits for all of the computing systems in the group does not exceed the total power limit for the group of computing systems. For example, the individual power limits for the servers within a rack can be set so that the sum of the individual power limits for all of the servers in the rack does not exceed the total power limit for the rack.

As noted above, with current approaches the individual power limits for the servers in a rack are set by uniformly dividing the total power limit for the rack by the number of servers in the rack. However, as also discussed above, such an approach is inefficient. In contrast to current approaches, the present disclosure proposes a dynamic approach to setting the power limits for the individual computing systems within a group of computing systems. Instead of setting the same power limit for each computing system, different power limits can be set based on the needs of the various computing systems. The techniques disclosed herein can take into consideration various characteristics of the computing systems and the workloads running on the computing systems when setting individual power limits. The power capping techniques disclosed herein can be considered to be dynamic because different power limits can be set for different computing systems.

In accordance with the present disclosure, different priority levels can be assigned to different computing systems within a group of computing systems. Different priority levels can indicate different degrees of priority or urgency for different computing systems. As one example, priority levels can be assigned based at least in part on the types of workloads that are running (and/or that are expected to run) on the computing systems. For example, suppose that some of the servers within a rack of servers are running high priority workloads, such as time-sensitive workloads or workloads for high priority users. These servers can be assigned a higher priority level than other servers within the rack.

When setting individual power limits for the computing systems within a group of computing systems, the priority levels of the computing systems can be taken into consideration. In general, with all else equal, computing systems with relatively high priority levels can be allocated higher power limits than computing systems with relatively low priority levels. For example, if a first computing system is assigned a higher priority level than a second computing system, the first computing system can receive a higher power limit than the second computing system because of the higher priority level.

The current utilization levels of the computing systems can also be taken into consideration when setting individual power limits. The utilization level of a computing system can be a measure of the extent to which the computing system is being utilized. Thus, a computing system that is actively processing one or more workloads has a higher utilization level than a computing system that is idle. In general, with all else equal, computing systems with relatively high utilization levels can be allocated higher power limits than computing systems with relatively low utilization levels. For example, if a first computing system and a second computing system are assigned equal priority levels, but the current power consumption of the first computing system is higher than the current power consumption of the second computing system, the first computing system can receive a higher power limit than the second computing system because of the higher power consumption.

FIG. 1 illustrates an example of an operating environment 100 in which dynamic power capping can be performed with respect to a group of computing systems 102. The group of computing systems 102 includes a first computing system 102a, a second computing system 102b, a third computing system 102c, and so forth. In general, a group of computing systems 102 can be a collection or aggregation of computing systems 102 that are considered or classified together because of one or more similarities. In some embodiments, the group of computing systems 102 can be a plurality of servers within a datacenter, which can be located within the same rack (or in other words, within the same physical structure).

The operating environment 100 shown in FIG. 1 also includes a component that is configured to perform management operations, including power management operations, for the group of computing systems 102. This component may be referred to herein as a group manager 104. In some embodiments, the group manager 104 can be implemented as software that runs on one or more of the computing systems 102 within the group. Alternatively, the group manager 104 can run on one or more other computing systems that are distinct from, but in electronic communication with, the computing systems 102 within the group. In embodiments where the group of computing systems 102 includes a plurality of servers within a rack, the group manager 104 can be a rack manager corresponding to the rack.

The power management operations that are performed by the group manager 104 can include dynamic power capping, as disclosed herein. FIG. 1 shows the group manager 104 with a dynamic power capping module 106. The dynamic power capping module 106 can be configured to implement the dynamic power capping techniques disclosed herein. FIG. 1 also shows various kinds of information that can be used by the dynamic power capping module 106 in connection with implementing the dynamic power capping techniques. This information may be referred to herein as dynamic power capping information 108.

The dynamic power capping information 108 can include a total power limit 110 for the group of computing systems 102. This total power limit 110 can represent the total amount of power that all of the computing systems 102 are collectively permitted to use.

In some embodiments, the group manager 104 can receive the total power limit 110 from another entity. For example, FIG. 1 shows a system management entity 112 in electronic communication with the group manager 104. In some embodiments, the system management entity 112 can determine the total power limit 110 for the group of computing systems 102 and communicate that information to the group manager 104. In embodiments where the group of computing systems 102 includes a plurality of servers within a datacenter, the system management entity 112 can be an entity that performs management operations for the datacenter.

The dynamic power capping information 108 can also include individual power limits 114 for the computing systems 102. In the depicted example, the dynamic power capping information 108 includes a first power limit 114a corresponding to the first computing system 102a, a second power limit 114b corresponding to the second computing system 102b, a third power limit 114c corresponding to the third computing system 102c, and so forth. The power limit 114 for a particular computing system 102 can represent the total amount of power that the computing system 102 is permitted to use.

To facilitate dynamic power capping, a plurality of different priority levels 116 can be defined for the computing systems 102. In some embodiments, two different priority levels 116 can be defined (e.g., a high priority level and a normal priority level). In other embodiments, more than two priority levels 116 can be defined.

Each computing system 102 can be assigned to one of the priority levels 116 that has been defined. The dynamic power capping information 108 can include priority information, namely, information about the priority levels 116 that have been assigned to the computing systems 102. In the depicted example, the dynamic power capping information 108 includes an indication of the priority level 116a that is assigned to the first computing system 102a, an indication of the priority level 116b that is assigned to the second computing system 102b, an indication of about the priority level 116c that is assigned to the third computing system 102c, and so forth.

The dynamic power capping information 108 can also include information about the utilization levels 118 of the computing systems 102. In the depicted example, the dynamic power capping information 108 includes an indication of the utilization level 118a of the first computing system 102a, an indication of the utilization level 118b of the second computing system 102b, an indication of the utilization level 118c of the third computing system 102c, and so forth.

In some embodiments, the utilization level of a computing system 102 can be based at least in part on the current power consumption of the computing system 102. For example, the utilization level of a computing system 102 can be proportional to the current power consumption of the computing system 102. In other words, a computing system 102 with a relatively high level of power consumption can be considered to have a relatively high utilization level, and vice versa.

FIG. 1 shows a power usage monitor 120 in electronic communication with the group of computing systems 102 and also in electronic communication with the group manager 104. The power usage monitor 120 can be configured to determine the current power consumption of the computing systems 102 and communicate this information to the group manager 104. The power usage monitor 120 can be implemented using hardware and/or software components. In some embodiments, the power usage monitor 120 can include one or more electronic circuits that measure the power consumption of the computing systems 102. In some embodiments, the power usage monitor 120 can include software that calculates the current power consumption of the computing systems 102 based on information received from one or more agents running on the computing systems 102.

In some embodiments, the utilization level 118 of a computing system 102 can be based at least in part on one or more other factors besides the current power consumption of the computing system 102. For example, the utilization level of a computing system 102 can be based at least in part on information about usage of processing resources, such as CPU utilization. One or more agents running on the computing systems 102 can communicate this kind of information to the group manager 104.

Figure 2:
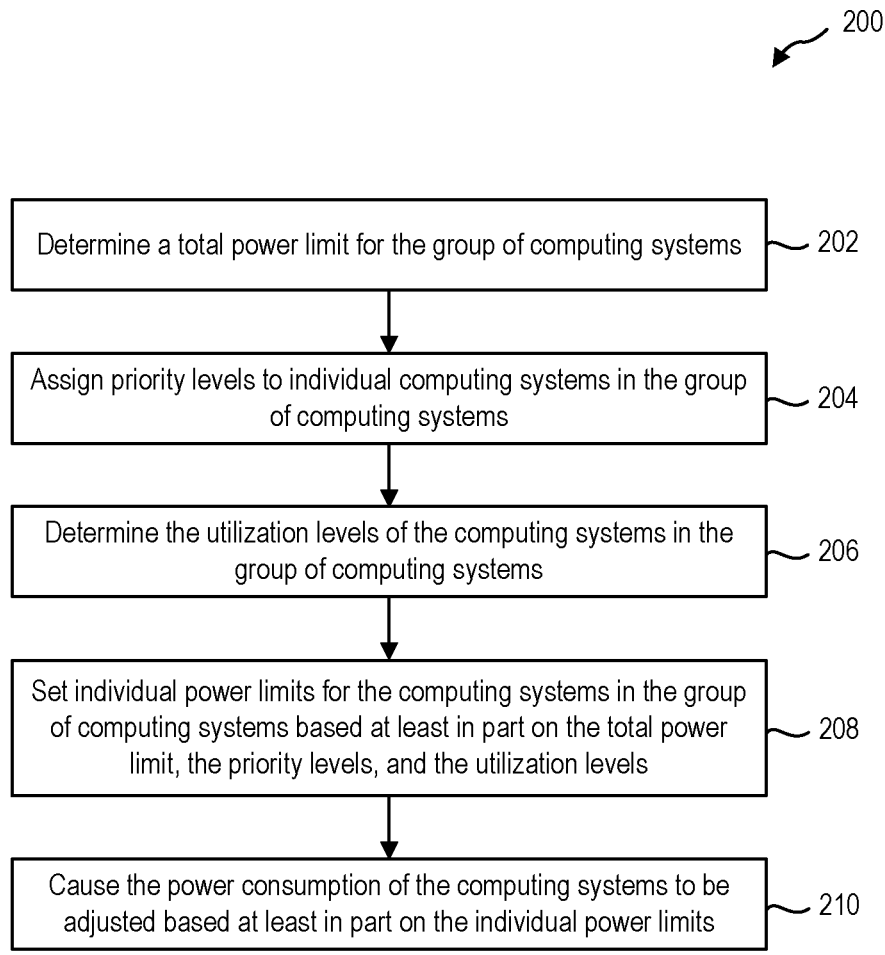
FIG. 2 illustrates an example of a method for dynamically performing power capping with respect to a group of computing systems.

FIG. 2 illustrates an example of a method 200 for dynamically performing power capping with respect to a group of computing systems 102 in accordance with the present disclosure. The method 200 will be described in relation to the operating environment 100 that is shown in FIG. 1. The method 200 can be implemented by an entity, such as a group manager 104, that is responsible for performing management operations for the group of computing systems 102.

The method 200 can include determining 202 a total power limit 110 for the group of computing systems 102. This total power limit 110 can represent the total amount of power that all of the computing systems 102 are collectively permitted to use. In some embodiments, another entity (such as a system management entity 112) can determine the total power limit 110 for the group of computing systems 102 and communicate that information to the group manager 104. Alternatively, the group manager 104 can itself calculate the total power limit 110 for the group of computing systems 102. In some embodiments, the group manager 104 can perform this calculation based at least in part on information received from one or more other entities.

The method 200 can also include assigning 204 priority levels 116 to individual computing systems 102 in the group of computing systems 102. As discussed above, a plurality of priority levels 116 can be defined for the computing systems 102, and the group manager 104 can assign one of the defined priority levels 116 to each of the computing systems 102. For example, suppose that two different priority levels 116, a high priority level and a normal priority level, are defined for the group of computing systems 102. In this example, each computing system 102 can be assigned either the high priority level or the normal priority level.

In some embodiments, priority levels 116 can be assigned based at least in part on the types of workloads that are running (and/or that are expected to run in the future) on the computing systems 102. As an example, suppose that the first computing system 102a is running (or is scheduled to run) high priority workloads, such as time-sensitive workloads or workloads for high priority users. In this case, the priority level 116a that is assigned to the first computing system 102a can be higher than the priority levels 116b-c that are assigned to the other computing systems 102b-c.

In some embodiments, at least some priority levels 116 can be assigned 204 to individual computing systems 102 based at least in part on user input. In other words, assigning 204 priority levels 116 to individual computing systems 102 can include receiving user input specifying at least some of the priority levels 116.

In some embodiments, at least some priority levels 116 can be assigned 204 to individual computing systems 102 based at least in part on analyzing historical information about the computing systems 102. In other words, assigning 204 priority levels 116 to individual computing systems 102 can include automatically determining at least some of the priority levels 116 based at least in part on historical information about the computing systems 102. For example, computing systems 102 that have historically been used to run higher priority workloads can be assigned higher priority levels 116 than computing systems 102 that have historically been used to run lower priority workloads.

The method 200 can also include determining 206 the utilization levels 118 of the computing systems 102 in the group of computing systems 102. This can include determining 206 the utilization level 118a of the first computing system 102a, determining 206 the utilization level 118b of the second computing system 102b, determining 206 the utilization level 118c of the third computing system 102c, and so forth. In some embodiments, determining 206 the utilization levels 118 of the computing systems 102 can include determining the power consumption of the computing systems 102. In some embodiments, the group manager 104 can receive information about the current power consumption of the computing systems 102 from one or more other entities, such as agents running on the computing systems and/or a power usage monitor 120 that is in electronic communication with the computing systems 102.

In some embodiments, determining 206 the utilization levels 118 of the computing systems 102 can include determining information about usage of processing resources, such as CPU utilization. In some embodiments, the group manager 104 can receive this kind of information from one or more other entities, such as agents running on the computing systems 102.

The method 200 can also include setting 208 individual power limits 114 for the computing systems 102 in the group of computing systems 102. As noted above, the individual power limit 114 for a particular computing system 102 can represent the total amount of power that the computing system 102 is permitted to use.

The individual power limits 114 for the computing systems 102 can be set 208 based at least in part on the total power limit 110 for the group of computing systems 102. In some embodiments, the individual power limits 114 can be calculated so that the sum of the individual power limits 114 for all of the computing systems 102 does not exceed the total power limit 110 that has been defined for the group of computing systems 102. More specifically, suppose that there are N computing systems 102, the term $P_{sys\_lim_i}$ represents the power limit for the $i^{th}$ computing system 102, and the term $P_{tot\_lim}$ represents the total power limit 110 for the group of computing systems 102. In this situation, the individual power limits 114 can be determined so that the following expression is satisfied:

$$\sum_{i=1}^{N} P_{sys\_lim_i} \leq P_{tot\_lim} \quad (1)$$

As noted above, with current approaches the individual power limits 114 for the computing systems 102 in a group of computing systems 102 (e.g., the servers in a rack of servers) are determined by dividing the total power limit 110 by the number of computing systems 102 in the group. In other words, the total power limit 110 for the group is uniformly divided among the computing systems 102 in the group. However, as also discussed above, such an approach is inefficient. In contrast to current approaches, the dynamic power capping techniques disclosed herein enable different individual power limits 114 to be set for different computing systems 102 based on the needs of the various computing systems 102.

In accordance with the present disclosure, the individual power limits 114 for the computing systems 102 in the group can be set based at least in part on the assigned priority levels 116 of the computing systems 102. In some embodiments, computing systems 102 with higher priority levels 116 can be provided with higher individual power limits 114 than computing systems 102 with lower priority levels 116. For example, in the scenario described earlier (in which the priority level 116a that is assigned to the first computing system 102a is higher than the priority levels 116b-c that are assigned to the other computing systems 102b-c), the individual power limit 114a assigned to the first computing system 102a can be higher than the individual power limits 114b-c assigned to the other computing systems 102b-c in the group.

The individual power limits 114 for the computing systems 102 in the group can also be set based at least in part on the utilization levels 118 of the computing systems 102. In some embodiments, where two different computing systems 102 have the same priority level 116, one of the computing systems 102 can be assigned a higher individual power limit 114 because of a higher utilization level 118. For example, consider a scenario in which the priority level 116b that is assigned to the second computing system 102b is equal to the priority level 116c that is assigned to the third computing system 102c, but the utilization level 118b of the second computing system 102b is higher than the utilization level 118c of the third computing system 102c. In this case, the power limit 114b for the second computing system 102b can be higher than the power limit 114c for the third computing system 102c.

The method 200 can also include causing 210 the power consumption of the computing systems 102 within the group to be adjusted based at least in part on the individual power limits 114. For example, if the current power consumption of a particular computing system 102 exceeds the individual power limit 114 that is set for that computing system 102, then the method 200 can include causing the computing system 102 to reduce its power consumption so that the power consumption of the computing system 102 does not exceed the individual power limit 114.

In some embodiments, the group manager 104 can simply notify each computing system 102 within the group about the individual power limit 114 that has been set for that computing system 102, and the computing systems 102 can themselves adjust their power consumption. Alternatively, in some embodiments the group manager 104 can send commands to the computing systems 102 that cause the computing systems 102 to adjust their power consumption.

There are many different ways that a computing system 102 can reduce its power consumption. For example, a computing system 102 can reduce its power consumption by reducing the frequency at which its CPU and/or GPU operates. As another example, a computing system 102 can reduce its power consumption by operating one or more of its components in a low power mode.

Another aspect of the present disclosure is related to techniques for dynamically performing power capping with respect to various subsystems of a computing system. In other words, in addition to performing dynamic power capping with respect to a group of computing systems, dynamic power capping can also be performed with respect to a plurality of individual subsystems (or in other words, individual components) of a single computing system.

As discussed above, individual power limits can be set for the computing systems within a group of computing systems (e.g., the servers within a rack). The individual power limit for a particular computing system can represent the total amount of power that the computing system is permitted to use. The total power limit for a particular computing system can be allocated among the subsystems (e.g., CPU, GPU, memory, storage, I/O subsystem, network interface controller) within the computing system. One way to do this would be to uniformly divide the total power limit for the computing system among the various subsystems within the computing system. However, as discussed above, such an approach is inefficient.

The present disclosure proposes a more intelligent approach to setting the power limits for the individual subsystems within a computing system. The techniques disclosed herein can take into consideration various characteristics of the individual subsystems and the workloads running on the computing system when setting power limits for individual subsystems. Instead of setting the same power limit for each individual subsystem, different power limits can be set based on the needs of the various subsystems and the needs of the workloads running on the computing system. The power capping techniques disclosed herein can be considered to be dynamic because different power limits can be set for different subsystems within a computing system.

In accordance with the present disclosure, different priority levels can be assigned to different subsystems within a computing system. Different priority levels can indicate different degrees of priority or urgency for different subsystems. In some embodiments, priority levels can be assigned based at least in part on the types of workloads that are running (and/or that are scheduled to run) on the computing system.

For example, suppose that a computing system is designed to run processor-intensive workloads. In other words, suppose that the computing system is designed to run workloads that require a significant amount of processing but do not require as much use of the other subsystems. In this case, the CPU can be assigned a higher priority than the other subsystems within the computing system.

As another example, suppose that a computing system is designed to run storage-intensive workloads. In other words, suppose that the computing system is designed to run workloads that require a significant amount of storage but do not require as much use of the other subsystems. In this case, the storage subsystem can be assigned a higher priority than the other subsystems within the computing system.

As another example, suppose that a computing system is designed to run artificial intelligence (AI) workloads, which typically require a significant amount of processing from GPUs. In this case, the GPU can be assigned a higher priority than the other subsystems within the computing system.

When setting individual power limits for the subsystems within a computing system, the priority levels of the subsystems can be taken into consideration. In general, with all else equal, subsystems with relatively high priority levels can be allocated higher power limits than subsystems with relatively low priority levels. For example, if a first subsystem is assigned a higher priority level than a second subsystem, the first subsystem can receive a higher power limit than the second subsystem because of the higher priority level.

The current power consumption of the subsystems can also be taken into consideration when setting individual power limits for the subsystems. In general, with all else equal, subsystems with relatively high power consumption can be allocated higher power limits than subsystems with relatively low power consumption. For example, if a first subsystem and a second subsystem are assigned equal priority levels but the current power consumption of the first subsystem is higher than the current power consumption of the second subsystem, the first subsystem can receive a higher power limit than the second subsystem because of the higher power consumption.

Figure 3:
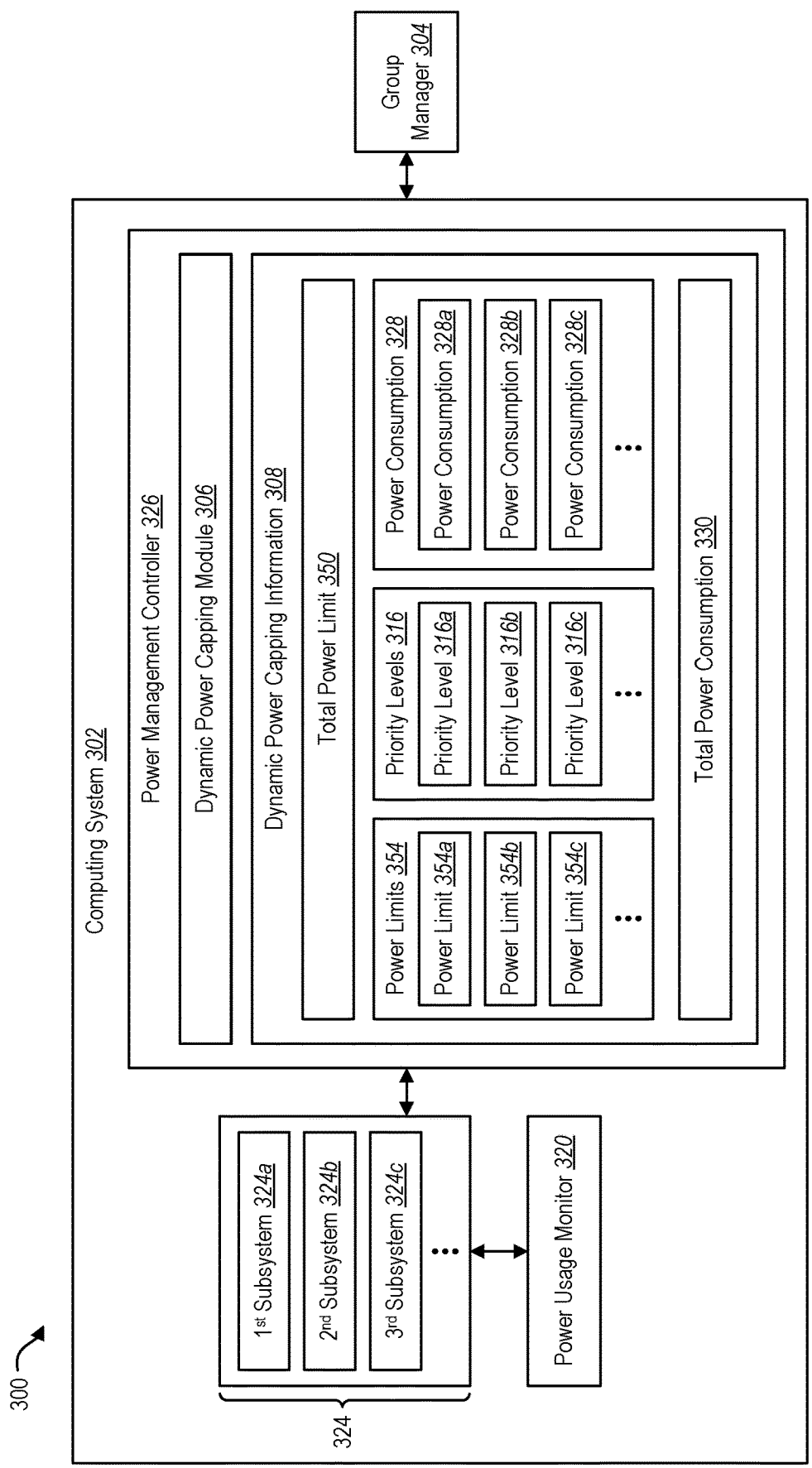
FIG. 3 illustrates an example of an operating environment in which dynamic power capping can be performed with respect to a plurality of subsystems within a computing system.

FIG. 3 illustrates an example of an operating environment 300 in which dynamic power capping can be performed with respect to a plurality of subsystems 324 within a computing system 302. In some embodiments, the computing system 302 can be part of a group of computing systems, such as the group of computing systems 102 shown in FIG. 1. For example, the computing system 302 can be a server located within a rack of servers in a datacenter.

The subsystems 324 are components within the computing system 302. Some examples of subsystems 324 include a CPU, memory, storage, an I/O subsystem, a GPU, and a network interface controller. In FIG. 3, the subsystems 324 are shown generally as a first subsystem 324a, a second subsystem 324b, a third subsystem 324c, and so forth.

The operating environment 300 also includes a power management controller 326 that is configured to perform power management operations for the subsystems 324 within the computing system 302. In some embodiments, the power management controller 326 can be implemented as an auxiliary service processor within the computing system 302. An auxiliary service processor is a specialized microcontroller within a computing system, separate from a general purpose processor. An example of an auxiliary service processor is a baseboard management controller (BMC). It can be useful for auxiliary service processors to be included in computing systems within a datacenter because they allow system administrators to perform various tasks remotely. For example, a system administrator can remotely communicate with an auxiliary service processor to take corrective actions, such as resetting or power cycling a computing system.

The power management operations that are performed by the power management controller 326 can include dynamic power capping, as disclosed herein. FIG. 3 shows the power management controller 326 with a dynamic power capping module 306. The dynamic power capping module 306 can be configured to implement the dynamic power capping techniques disclosed herein. FIG. 3 also shows various kinds of information that can be used by the dynamic power capping module 306 in connection with implementing the dynamic power capping techniques. This information may be referred to herein as dynamic power capping information 308.

The dynamic power capping information 308 can include a total power limit 350 for the computing system 302. This total power limit 350 can represent the total amount of power that the computing system 302 is permitted to use.

FIG. 3 shows a group manager 304 in electronic communication with the computing system 302. As noted above, in some embodiments the computing system 302 can be part of a group of computing systems, such as the group of computing systems 102 shown in FIG. 1. The group manager 304 can be configured to perform management operations, including power management operations, for all of the computing systems in the group, including the computing system 302 shown in FIG. 3. In this way, the group manager 304 can be similar to the group manager 104 shown in FIG. 1. In some embodiments, the group manager 304 can determine the total power limit 350 for the computing system 302 and communicate that information to the power management controller 326. In some embodiments, the group manager 304 can determine the total power limit 350 for the computing system 302 in the manner described above in connection with FIGS. 1 and 2.

The dynamic power capping information 308 also includes individual power limits 354 for the various subsystems 324 in the computing system 302. More specifically, the dynamic power capping information 308 includes a power limit 354a for the first subsystem 324a, a power limit 354b for the second subsystem 324b, a power limit 354c for the third subsystem 324c, and so forth. The individual power limit 354 for a particular subsystem 324 can represent the total amount of power that the subsystem 324 is permitted to use.

To facilitate dynamic power capping, different priority levels 316 can be defined for the various subsystems 324 within the computing system 302. The dynamic power capping information 308 can include information about the priority levels 316 that have been defined. In some embodiments, two priority levels 316 can be defined (e.g., a high priority level and a normal priority level). In other embodiments, more than two priority levels 316 can be defined.

Each of the subsystems 324 in the computing system 302 can be assigned to one of the priority levels 316 that has been defined. The dynamic power capping information 308 can include information about the priority levels 316 that have been assigned to the various subsystems 324. In the depicted example, the dynamic power capping information 308 includes an indication of the priority level 316a that has been assigned to the first subsystem 324a, an indication of the priority level 316b that has been assigned to the second subsystem 324b, an indication of the priority level 316c that has been assigned to the third subsystem 324c, and so forth.

The dynamic power capping information 308 can also include information about the power consumption 328 of the subsystems 324 in the computing system 302. In the depicted example, the dynamic power capping information 308 includes an indication of the power consumption 328a of the first subsystem 324a, an indication of the power consumption 328b of the second subsystem 324b, an indication of the power consumption 328c of the third subsystem 324c, and so forth. The power consumption 328 of a particular subsystem 324 can represent the amount of power that is currently being consumed by that subsystem 324.

FIG. 3 shows a power usage monitor 320 in electronic communication with the subsystems 324 in the computing system 302 and also in electronic communication with the power management controller 326. The power usage monitor 320 can be configured to measure the current power consumption 328 of the subsystems 324 in the computing system 302 and to communicate this information to the power management controller 326.

The dynamic power capping information 308 can also include information about the total power consumption 330 of the computing system 302. The total power consumption 330 can represent the sum of the power consumption 328 of all of the individual subsystems 324 in the computing system 302.

Figure 4:
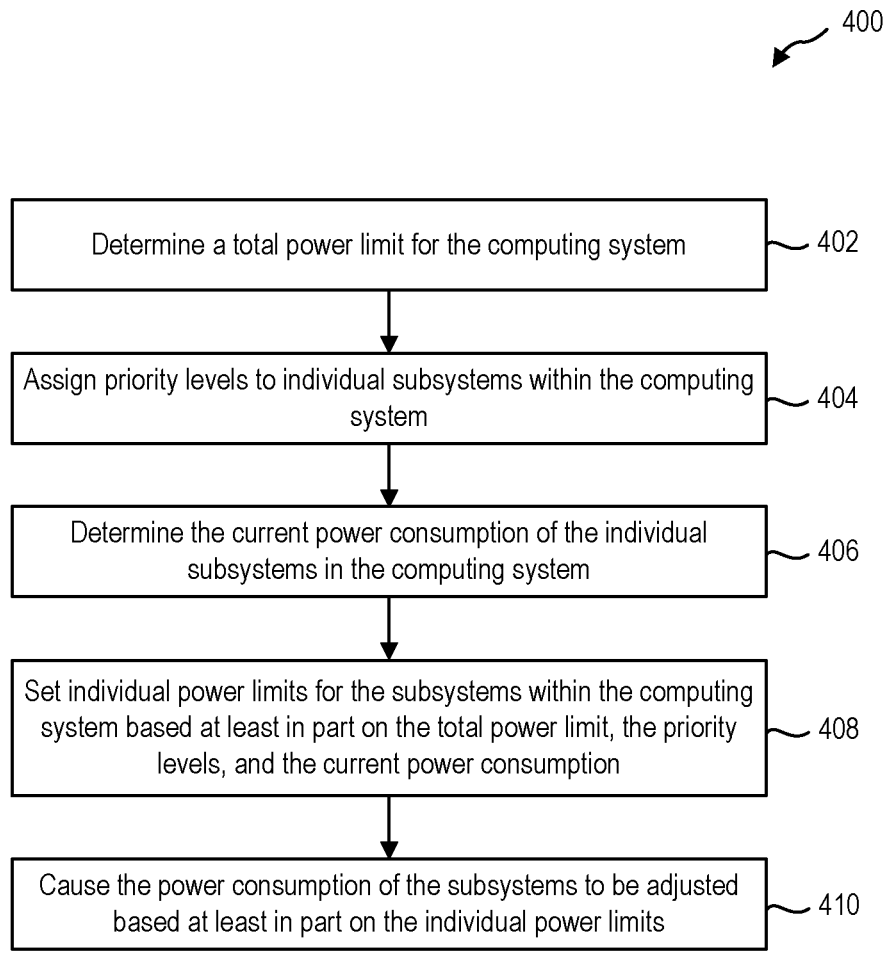
FIG. 4 illustrates an example of a method for dynamically performing power capping with respect to various subsystems of a computing system.

FIG. 4 illustrates an example of a method 400 for dynamically performing power capping with respect to various subsystems 324 of a computing system 302 in accordance with the present disclosure. The method 400 will be described in relation to the computing system 302 that is shown in FIG. 3. The method 400 can be implemented by an entity, such as a power management controller 326, that is responsible for performing power management operations for the computing system 302.

The method 400 can include determining 402 a total power limit 350 for the computing system 302. This total power limit 350 can represent the total amount of power that the computing system 302 is permitted to use. In some embodiments, another entity (such as a group manager 304) can determine the total power limit 350 for the computing system 302 and communicate that information to the power management controller 326. Alternatively, the power management controller 326 can itself calculate the total power limit 350 for the computing system 302. In some embodiments, the power management controller 326 can perform this calculation based at least in part on information received from one or more other entities.

The method 400 can also include assigning 404 priority levels 316 to individual subsystems 324 within the computing system 302. As discussed above, a plurality of priority levels 316 can be defined for the subsystems 324 in the computing system 302, and the power management controller 326 can assign one of the defined priority levels 316 to each of the subsystems 324 in the computing system 302. For example, suppose that two different priority levels 316, a high priority level and a normal priority level, are defined for the subsystems 324 within the computing system 302. In this example, each subsystem 324 can be assigned either the high priority level or the normal priority level.

In some embodiments, priority levels 316 can be assigned based at least in part on the types of workloads that are running (and/or that are expected to run in the future) on the computing system 302. For example, if the computing system 302 is designed to run processor-intensive workloads, the CPU can be assigned a higher priority than the other subsystems 324 within the computing system 302. As another example, if the computing system 302 is designed to run workloads that require a significant amount of storage but do not require as much use of the other subsystems 324, the storage subsystem can be assigned a higher priority than the other subsystems 324 within the computing system 302. As another example, if the computing system 302 is designed to run artificial intelligence (AI) workloads, the GPU can be assigned a higher priority than the other subsystems 324 within the computing system 302.

In some embodiments, at least some priority levels 316 can be assigned 404 to individual subsystems 324 based at least in part on user input. In other words, assigning 404 priority levels 316 to individual subsystems 324 can include receiving user input specifying at least some of the priority levels 316.

In some embodiments, at least some priority levels 316 can be assigned 404 to individual subsystems 324 based at least in part on analyzing historical information about the subsystems 324. In other words, assigning 404 priority levels 316 to individual subsystems 324 can include automatically determining at least some of the priority levels 316 based at least in part on historical information about the subsystems 324. For example, if the computing system 302 has historically been used to run workloads that require high usage of certain subsystems 324, those subsystems 324 can be assigned higher priority levels 316 than other subsystems 324.

The method 400 can also include determining 406 the current power consumption 328 of the individual subsystems 324 within the computing system 302. This can include determining 406 the current power consumption 328a of the first subsystem 324a, determining 406 the current power consumption 328b of the second subsystem 324b, determining 406 the current power consumption 328c of the third subsystem 324c, and so forth. In some embodiments, the power management controller 326 can receive information about the current power consumption 328 of the subsystems 324 within the computing system 302 from one or more other entities. For example, in some embodiments a power usage monitor 320 can determine the current power consumption 328 of the subsystems 324 within the computing system 302 and communicate that information to the power management controller 326.

The method 400 can also include setting 408 individual power limits 354 for the subsystems 324 within the computing system 302. As noted above, the individual power limit 354 for a particular subsystem 324 can represent the total amount of power that the subsystem 324 is permitted to use.

The individual power limits 354 for the subsystems 324 can be set 408 based at least in part on the total power limit 350 for the computing system 302. In some embodiments, the individual power limits 354 can be calculated so that the sum of the individual power limits 354 for all of the subsystems 324 in the computing system 302 does not exceed the total power limit 350 for the computing system 302. More specifically, suppose that there are M subsystems 324 in the computing system 302, $P_{sub\_lim_i}$ represents the power limit for the $i^{th}$ subsystem 324, and $P_{tot\_lim_{sys}}$ represents the total power limit 350 for the computing system 302. In this situation, the individual power limits 354 can be calculated so that the following expression is satisfied:

$$\sum_{i=1}^{M} P_{sub\_lim_i} \le P_{tot\_lim_{sys}} \qquad (2)$$

As noted above, with current approaches power capping is applied uniformly to the various subsystems 324 in the computing system 302. However, as also discussed above, such an approach is inefficient. In contrast to current approaches, the dynamic power capping techniques disclosed herein enable power capping to be applied dynamically with respect to different subsystems 324 based on the needs of the subsystems 324 themselves as well as the needs of the computing system 302 as a whole.

In accordance with the present disclosure, the individual power limits 354 for the subsystems 324 in the computing system 302 can be set 408 based at least in part on the assigned priority levels 316 of the subsystems 324. In some embodiments, subsystems 324 with higher priority levels 316 can be provided with higher individual power limits 354 than subsystems 324 with lower priority levels 316. For example, consider a scenario in which the first subsystem 324a is assigned a high priority level and the other subsystems 324b-c are assigned a normal priority level. In this case, the power limit 354a assigned to the first subsystem 324a can be higher than the power limits 354b-c assigned to the other subsystems 324b-c in the computing system 302.

The individual power limits 354 for the subsystems 324 in the computing system 302 can also be set 408 based at least in part on the current power consumption 328 of the subsystems 324 in the computing system 302. For example, consider a scenario in which the second subsystem 324b and the third subsystem 324c are both assigned the same priority level 316, but the power consumption 328b of the second subsystem 324b is higher than the power consumption 328c of the third subsystem 324c. In this case, the power limit 354b for the second subsystem 324b can be higher than the power limit 354c for the third subsystem 324c.

The method 400 can also include causing 410 the power consumption of the subsystems 324 within the computing system 302 to be adjusted based at least in part on the individual power limits 354. For example, if the current power consumption 328 of a particular subsystem 324 exceeds the individual power limit 354 that is set for that subsystem 324, then the method 400 can include causing 410 the subsystem 324 to reduce its power consumption so that the power consumption 328 of the subsystem 324 does not exceed the individual power limit 354. In some embodiments, the power management controller 326 can send commands to the subsystems 324 that cause the subsystems 324 within the computing system 302 to adjust their power consumption.

Figure 5:
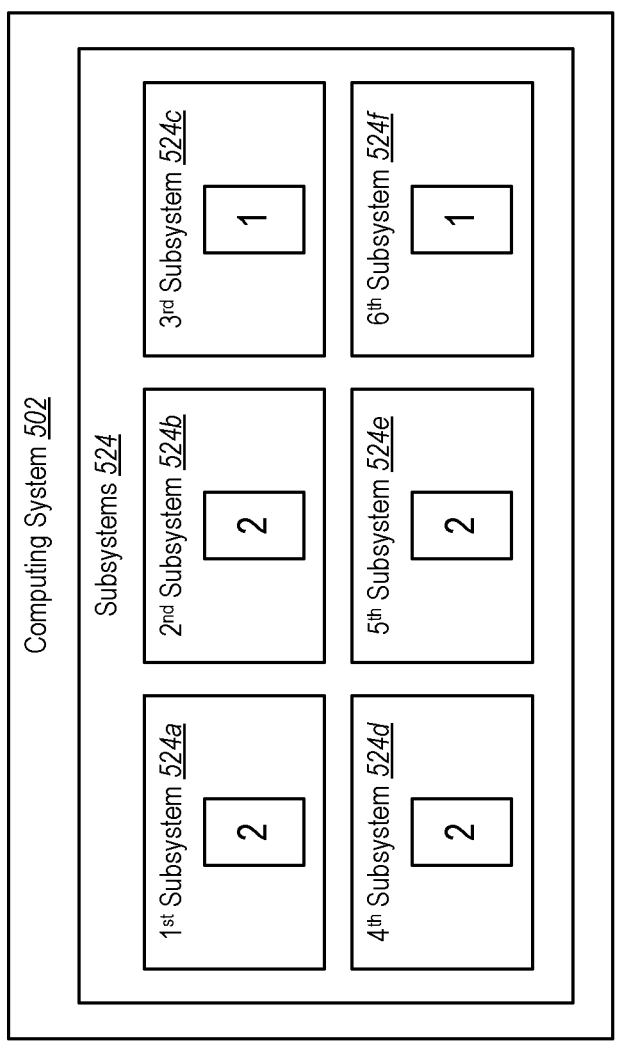
FIG. 5 illustrates an example showing how weights can be utilized to implement dynamic power capping in a computing system that includes a plurality of subsystems.

FIG. 5 illustrates an example showing how weights can be utilized to implement dynamic power capping in a computing system 502 that includes a plurality of subsystems 524. A weight can be assigned to each subsystem 524. In the depicted example, some of the subsystems 524 (the first subsystem 524a, second subsystem 524b, fourth subsystem 524d, and fifth subsystem 524e) are assigned a weight of two, while other subsystems 524 (the third subsystem 524c and sixth subsystem 524f) are assigned a weight of one.

In some embodiments, the total power limit for the computing system 502 can be distributed among the subsystems 524 based at least in part on the weights that have been assigned to the subsystems 524. Subsystems 524 with higher weights can receive higher individual power limits.

For example, suppose that the total power limit for the computing system 502 is 1000 W. If this amount of power is uniformly distributed among the subsystems 524, then each subsystem 524 would have an individual power limit of approximately 167 W. However, if the total power limit is distributed based on the weights, then the subsystems 524a, 524b, 524d, 524e that have been assigned a weight of two would receive an individual power limit of 200 W, while the subsystems 524c, 524f that have been assigned a weight of one would receive an individual power limit of 100 W.

The weights for the subsystems 524 can be determined based at least in part on the priority levels that have been assigned to the subsystems 524. In some embodiments, subsystems 524 with higher priority levels can be assigned higher weights than subsystems 524 with lower priority levels. The weights for the subsystems 524 can also be determined based at least in part on the power consumption levels that have been assigned to the subsystems 524. For example, among subsystems 524 with equal priority levels, subsystems 524 with higher power consumption levels can be assigned higher weights than subsystems 524 with lower power consumption levels.

Figure 6:
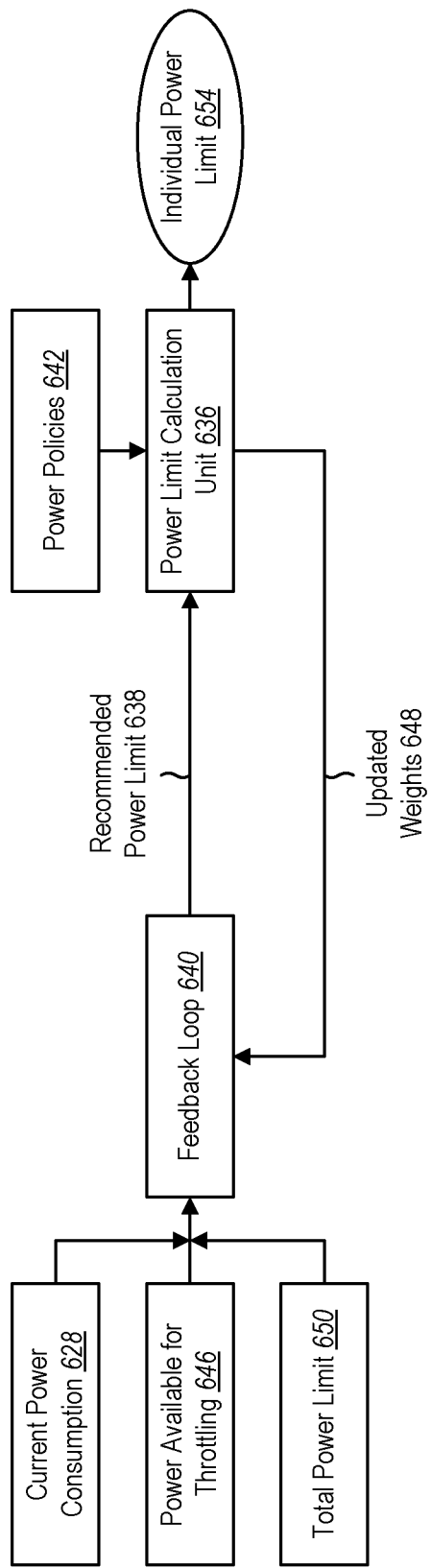
FIG. 6 illustrates an example showing how an individual power limit can be set for a particular subsystem within a computing system.

FIG. 6 illustrates another example showing how dynamic power capping can be performed in accordance with the present disclosure. The depicted example shows how an individual power limit 654 can be set for a particular subsystem within a computing system.

The entity that calculates the individual power limit 654 is represented as a power limit calculation unit 636 in FIG. 6. The calculation of the individual power limit 654 can be based at least in part on a recommended power limit 638 provided by a feedback loop 640. The calculation of the individual power limit 654 can also be based at least in part on power policies 642. The power policies 642 can include, among other things, priority levels for the various subsystems within the computing system.

The feedback loop 640 can determine the recommended power limit 638 for a particular subsystem based at least in part on the current power consumption 628 of the subsystem, the power available for throttling 646, the total power limit 650 for the computing system, and updated weights 648 provided by the power limit calculation unit 636.

For example, in some embodiments the feedback loop 640 can initially produce a recommended power limit 638 based on the current power consumption 628 of the subsystem, the power available for throttling 646, and the total power limit 650 for the computing system. The recommended power limit 638 can be provided to the power limit calculation unit 636. The power limit calculation unit 636 can modify the recommended power limit 638 based on the power policies 642 (e.g., priorities of subsystems). This produces updated weights 648, which are provided to the feedback loop 640. The feedback loop 640 then updates the recommended power limit 654 based on the updated weights 648, and the power limit calculation unit 636 sets the individual power limit 654 based on the updated recommended power limit 638.

Figure 7:
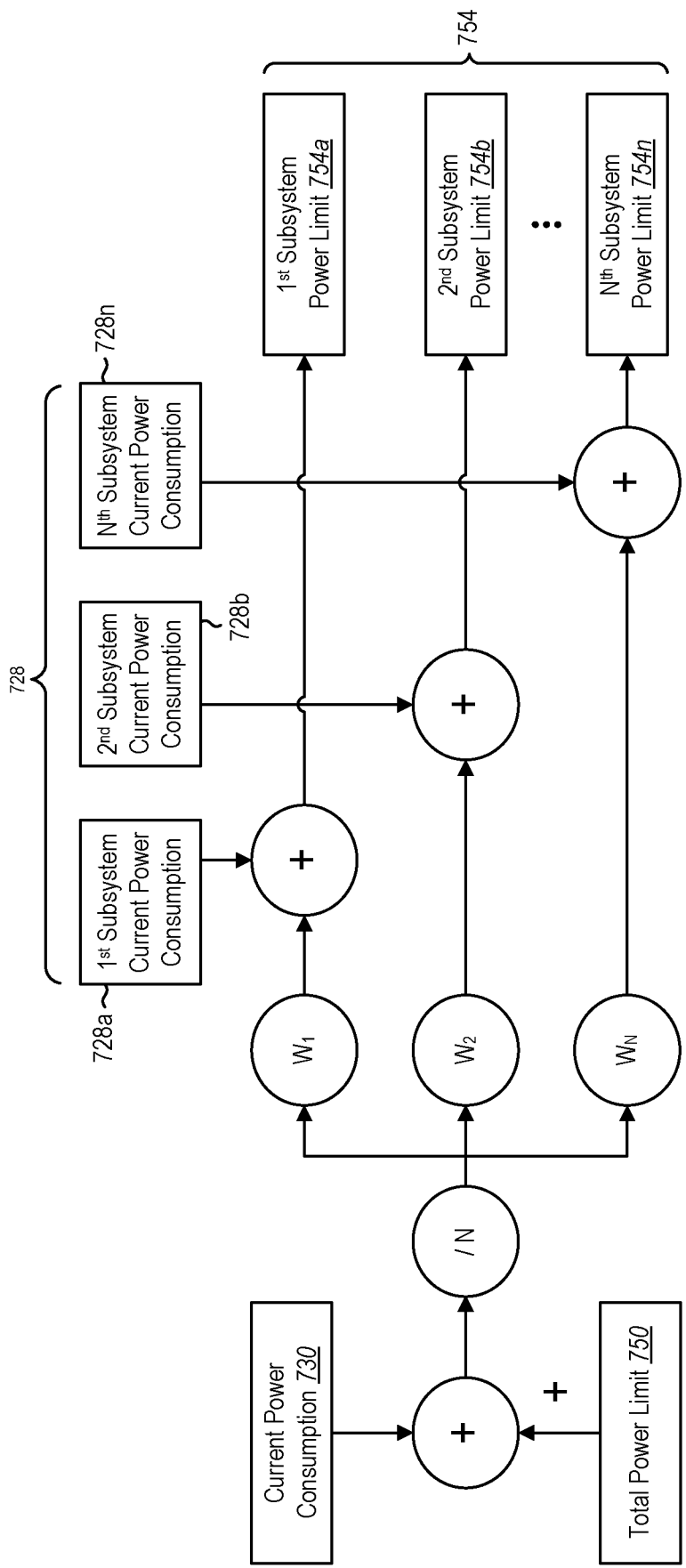
FIG. 7 illustrates an example showing how a plurality of individual power limits can be set for a plurality of subsystems within a computing system.

FIG. 7 illustrates another example showing how dynamic power capping can be performed in accordance with the present disclosure. The depicted example shows how a plurality of individual power limits 754 can be set for a plurality of subsystems within a computing system.

In the depicted example, it will be assumed that there are N subsystems within a computing system, and that N weights are used to calculate the individual power limits 754 for the N subsystems. FIG. 7 shows a first weight $W_1$ that is used to calculate a power limit 754*a* for a first subsystem, a second weight $W_2$ that is used to calculate a power limit 754*b* for a second subsystem, and an $N^{th}$ weight $W_N$ that is used to calculate a power limit 754*n* for an $N^{th}$ subsystem.

The difference between the total power limit 750 for the computing system and the current power consumption 730 of the computing system is divided by N and multiplied by the N weights $W_1, W_2, \ldots, W_N$. The resulting products can then be added to the corresponding current power consumption values for the N subsystems to determine the individual power limits 754. More specifically, the power limit for the $j^{th}$ subsystem can be determined by the following equation:

$$P_{sub\_limit_j} = \frac{P_{sys\_limit} - P_{sys\_con}}{N} * W_j + P_{sub\_con_j} \quad (3)$$

In equation (3), the expression $P_{sub\_limit_j}$ represents the power limit for the $j^{th}$ subsystem. The expression $P_{sys\_limit}$ represents the total power limit 750 for the computing system. The expression $P_{sys\_con}$ represents the total current power consumption 730 of the computing system (i.e., the sum of the individual subsystems' power consumption). The expression $W_j$ represents the weight for the $j^{th}$ subsystem.

The expression $P_{sub\_con_j}$ represents the current power consumption 728 of the $j^{th}$ subsystem.

In other words, the difference between the total power limit 750 for the computing system and the total current power consumption 730 of the computing system is applied proportionally to the various subsystems in the computing system. In equation (3), this operation is represented by the expression $$\frac{P_{sys\_limit} - P_{sys\_con}}{N}.$$

In other words, the expression $$\frac{P_{sys\_limit} - P_{sys\_con}}{N}$$

represents a proportional difference corresponding to a particular subsystem. The weights are then applied to these proportional differences. In equation (3), this operation is represented by the expression $$\frac{P_{sys\_limit} - P_{sys\_con}}{N} * W_j.$$

In the depicted example, the weights for the subsystems can be determined based at least in part on the priority levels that have been assigned to the subsystems. In some embodiments, subsystems with higher priority levels can be assigned higher weights than subsystems with lower priority levels. Thus, in the depicted example, the power limits 754 for the subsystems can depend on the priority levels that have been assigned to the subsystems as well as the current power consumption of the subsystems.

Figure 8:
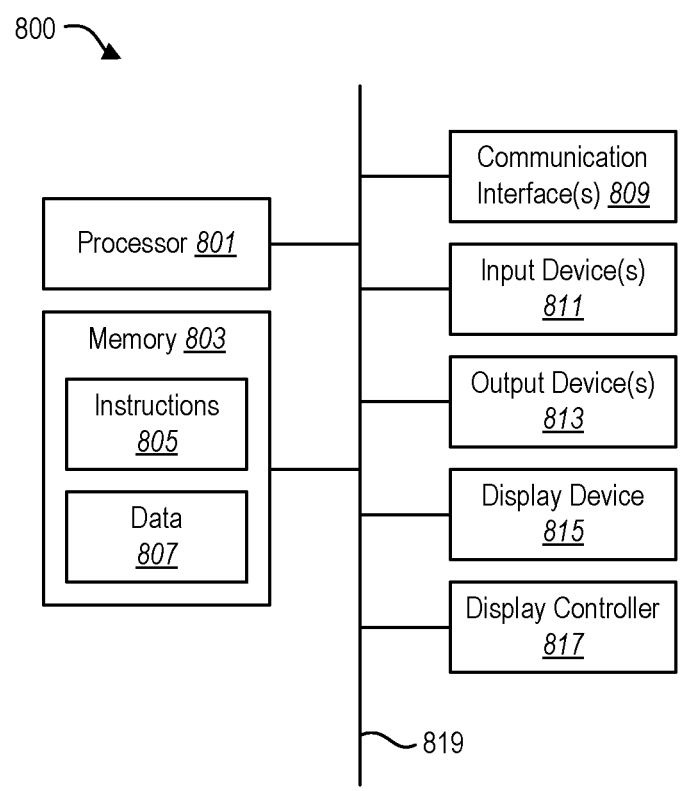
FIG. 8 illustrates certain components that can be included within a computing system.

Reference is now made to FIG. 8. One or more computing systems 800 can be used to implement at least some aspects of the techniques disclosed herein. FIG. 8 illustrates certain components that can be included within a computing system 800.

The computing system 800 includes a processor 801 and memory 803 in electronic communication with the processor 801. Instructions 805 and data 807 can be stored in the memory 803. The instructions 805 can be executable by the processor 801 to implement some or all of the methods, steps, operations, actions, or other functionality that is disclosed herein. Executing the instructions 805 can involve the use of the data 807 that is stored in the memory 803. Unless otherwise specified, any of the various examples of modules and components described herein can be implemented, partially or wholly, as instructions 805 stored in memory 803 and executed by the processor 801. Any of the various examples of data described herein can be among the data 807 that is stored in memory 803 and used during execution of the instructions 805 by the processor 801.

Although just a single processor 801 is shown in the computing system 800 of FIG. 8, in an alternative configuration, a combination of processors (e.g., an ARM and DSP) could be used.

The computing system 800 can also include one or more communication interfaces 809 for communicating with other electronic devices. The communication interface(s) 809 can be based on wired communication technology, wireless communication technology, or both. Some examples of communication interfaces 809 include a Universal Serial Bus (USB), an Ethernet adapter, a wireless adapter that operates in accordance with an Institute of Electrical and Electronics Engineers (IEEE) 802.11 wireless communication protocol, a Bluetooth® wireless communication adapter, and an infrared (IR) communication port.

A computing system 800 can also include one or more input devices 811 and one or more output devices 813. Some examples of input devices 811 include a keyboard, mouse, microphone, remote control device, button, joystick, trackball, touchpad, and lightpen. One specific type of output device 813 that is typically included in a computing system 800 is a display device 815. Display devices 815 used with embodiments disclosed herein can utilize any suitable image projection technology, such as liquid crystal display (LCD), light-emitting diode (LED), gas plasma, electroluminescence, or the like. A display controller 817 can also be provided, for converting data 807 stored in the memory 803 into text, graphics, and/or moving images (as appropriate) shown on the display device 815. The computing system 800 can also include other types of output devices 813, such as a speaker, a printer, etc.

The various components of the computing system 800 can be coupled together by one or more buses, which can include a power bus, a control signal bus, a status signal bus, a data bus, etc. For the sake of clarity, the various buses are illustrated in FIG. 8 as a bus system 819.

The techniques described herein may be implemented in hardware, software, firmware, or any combination thereof, unless specifically described as being implemented in a specific manner. Any features described as modules, components, or the like may also be implemented together in an integrated logic device or separately as discrete but interoperable logic devices. If implemented in software, the techniques may be realized at least in part by a non-transitory computer-readable medium having computer-executable instructions stored thereon that, when executed by at least one processor, perform some or all of the steps, operations, actions, or other functionality disclosed herein. The instructions may be organized into routines, programs, objects, components, data structures, etc., which may perform particular tasks and/or implement particular data types, and which may be combined or distributed as desired in various embodiments.

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The term "determining" (and grammatical variants thereof) encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The described embodiments are to be considered as illustrative and not restrictive, and the present disclosure may be embodied in other forms besides those specifically described herein. The scope of the disclosure is, therefore, indicated by the appended claims rather than by the foregoing description. Changes that come within the meaning and range of equivalency of the claims are to be embraced within their scope.

What is claimed is:

1. A method for dynamically performing power capping with respect to a group of computing systems, the group of computing systems comprising a plurality of individual computing systems, the method comprising:
   assigning different priority levels to the plurality of individual computing systems within the group of computing systems based at least in part on types of processing resources associated with running different types of workloads on individual computing systems form the plurality of individual computing systems;
   determining a total power limit for the group of computing systems;
   determining utilization levels of the plurality of individual computing systems within the group of computing systems;
   setting individual power limits for the plurality of individual computing systems within the group of computing systems based at least in part on the total power limit, the different priority levels, and the utilization levels, wherein an individual power limit for an individual computing system indicates a total amount of power that the individual computing system is permitted to use; and
   causing power consumption of the plurality of individual computing systems within the group of computing systems to be adjusted to satisfy the individual power limits.

2. The method of claim 1, wherein:
   assigning the different priority levels comprises assigning a first priority level to a individual first computing system and assigning a second priority level to a second individual computing system;
   setting the individual power limits comprises setting a first power limit for the first individual computing system and setting a second power limit for the second individual computing system;
   the first priority level is higher than the second priority level; and
   the first power limit is higher than the second power limit.

3. The method of claim 1, wherein:
   assigning the different priority levels comprises assigning a first priority level to a first individual computing system and assigning a second priority level to a individual second computing system;
   determining the utilization levels comprises determining a first utilization level of the first individual computing system and determining a second utilization level of the second individual computing system;
   setting the individual power limits comprises setting a first power limit for the first individual computing system and setting a second power limit for the second individual computing system;

the first priority level is equal to the second priority level;
the first utilization level is higher than the second utilization level; and
the first power limit is higher than the second power limit.

4. The method of claim 1,
wherein assigning the different priority levels comprises receiving user input specifying at least some of the different priority levels for the plurality of individual computing systems, or
wherein assigning the different priority levels comprises automatically determining at least some of the different priority levels based at least in part on historical information about the plurality of individual computing systems within the group of computing systems.

5. The method of claim 1, wherein assigning the different priority levels includes:
assigning a first priority level to a first computing system from the plurality of individual computing systems based on the first computing system having a processor-intensive workload; and
assigning a second priority level to a second computing system from the plurality of individual computing systems based on the second computing system having a storage-intensive workload.

6. The method of claim 5, wherein setting the individual power limits for the plurality of individual computing systems includes:
assigning a higher CPU limit for the first computing system than the second computing system based on the first computing system having the processor-intensive workload; and
assigning a higher storage limit for the second computing system than the first computing system based on the second computing system having the storage-intensive workload.

7. A method for dynamically performing power capping with respect to a plurality of individual subsystems within a computing system, comprising:
assigning different priority levels to the plurality of individual subsystems within the computing system based at least in part on types of processing resources associated with running different types of workloads on individual subsystems form the plurality of individual subsystems;
determining a total power limit for the computing system;
determining current power consumption of the plurality of individual subsystems within the computing system;
setting individual power limits for the plurality of individual subsystems within the computing system based at least in part on the different priority levels, the total power limit, and the current power consumption, wherein an individual power limit for an individual subsystem indicates a total amount of power that the individual subsystem is permitted to use; and
causing power consumption of the plurality of individual subsystems within the computing system to be adjusted to satisfy the individual power limits.

8. The method of claim 7, wherein:
assigning the different priority levels comprises assigning a first priority level to a first subsystem and assigning a second priority level to a second subsystem;
setting the individual power limits comprises setting a first power limit for the first subsystem and setting a second power limit for the second subsystem;
the first priority level is higher than the second priority level; and
the first power limit is higher than the second power limit.

9. The method of claim 7, wherein:
assigning the different priority levels comprises assigning a first priority level to a first subsystem and assigning a second priority level to a second subsystem;
determining the current power consumption comprises determining a first power consumption of the first subsystem and determining a second power consumption of the second subsystem;
setting the individual power limits comprises setting a first power limit for the first subsystem and setting a second power limit for the second subsystem;
the first priority level is equal to the second priority level;
the first power consumption is higher than the second power consumption; and
the first power limit is higher than the second power limit.

10. The method of claim 7,
wherein assigning the different priority levels comprises receiving user input specifying at least some of the different priority levels for the plurality of individual subsystems, or
wherein assigning the different priority levels comprises automatically determining at least some of the different priority levels based at least in part on historical information about the plurality of individual subsystems.

11. The method of claim 7, further comprising:
determining a plurality of weights corresponding to the plurality of individual subsystems within the computing system, wherein the plurality of weights depend at least in part on the different priority levels that have been assigned to the plurality of individual subsystems; and
applying the plurality of weights to a proportional difference between the total power limit for the computing system and a total current power consumption of the computing system.

12. The method of claim 7, wherein assigning the different priority levels includes:
assigning a first priority level to a first subsystem from the plurality of individual subsystems within the computing system based on the first subsystem having a processor- intensive workload; and
assigning a second priority level to a second subsystem from the plurality of individual subsystems within the computing system based on the second subsystem having a storage- intensive workload.

13. The method of claim 12, wherein setting the individual power limits for the plurality of individual computing systems includes:
assigning a higher CPU limit for the first subsystem than the second subsystem based on the first subsystem having the processor-intensive workload; and
assigning a higher storage limit for the second subsystem than the first subsystem based on the second subsystem having the storage-intensive workload.

14. A system for dynamically performing power capping with respect to a plurality of individual subsystems within a computing system, comprising:
one or more processors;
memory in electronic communication with the one or more processors;
priority information stored in the memory, the priority information comprising different priority levels for at least some of the plurality of individual subsystems within the computing system; and
instructions stored in the memory, the instructions being executable by the one or more processors to:

determine a total power limit for the computing system;

determine current power consumption of the plurality of individual subsystems within the computing system;

assign a weight to each of the plurality of individual subsystems based at least in part on the total power limit and the current power consumption levels;

set individual power limits for the plurality of individual subsystems within the computing system based at least in part on the weight of each of the plurality of individual subsystem, wherein an individual power limit for an individual subsystem indicates a total amount of power that the individual subsystem is permitted to use; and cause power consumption of the plurality of individual subsystems within the computing system to be adjusted to satisfy the individual power limits.

15. The system of claim 14, wherein:

the different priority levels comprise a first priority level assigned to a first subsystem and a second priority level assigned to a second subsystem;

setting the individual power limits comprises setting a first power limit for the first subsystem and setting a second power limit for the second subsystem;

the first priority level is higher than the second priority level; and the first power limit is higher than the second power limit.

16. The system of claim 14, wherein:

the different priority levels comprise a first priority level assigned to a first subsystem and a second priority level assigned to a second subsystem;

determining the current power consumption comprises determining a first power consumption of the first subsystem and determining a second power consumption of the second subsystem;

setting the individual power limits comprises setting a first power limit for the first subsystem and setting a second power limit for the second subsystem;

the first priority level is equal to the second priority level;

the first power consumption is higher than the second power consumption; and the first power limit is higher than the second power limit.

17. The system of claim 14, wherein the instructions are further executable by the one or more processors to:

determine a total power consumption for the computing system based on the current power consumption of the plurality of individual subsystems;

determine a system power difference of the computing system based on the total power consumption and the total power limit; and proportion the system power difference to the plurality of individual subsystems based on the weight of each of the plurality of individual subsystems.

18. The system of claim 14, wherein the individual power limits for the plurality of individual subsystems are recommended individual power limits, and wherein the instructions are further executable by the one or more processors to:

provide an updated weight for each of the plurality of individual subsystems based on one or more power policies and the recommended individual power limits; and provide updated individual power limits for the plurality of individual subsystems based on the updated weight for each of the plurality of individual subsystems.

* * * * *